(12) United States Patent
Yang et al.

(10) Patent No.: US 10,661,399 B2
(45) Date of Patent: May 26, 2020

(54) SINGLE-DRIVE RIGID-FLEXIBLE COUPLING PRECISION MOTION PLATFORM AND REALIZATION METHOD AND APPLICATION THEREOF

(71) Applicant: GUANGDONG UNIVERSITY OF TECHNOLOGY, Guangzhou (CN)

(72) Inventors: Zhijun Yang, Guangzhou (CN); Youdun Bai, Guangzhou (CN); Xin Chen, Guangzhou (CN); Chaoran Chen, Guangzhou (CN)

(*) Notice: Subject to any disclaimer, the term of this patent is extended or adjusted under 35 U.S.C. 154(b) by 103 days.

(21) Appl. No.: 15/844,571

(22) Filed: Dec. 17, 2017

(65) Prior Publication Data

US 2018/0104779 A1    Apr. 19, 2018

Related U.S. Application Data

(63) Continuation of application No. PCT/CN2016/093259, filed on Aug. 4, 2016.

(30) Foreign Application Priority Data

Jun. 29, 2016  (CN) .......................... 2016 1 0508540

(51) Int. Cl.
*H02K 41/02* (2006.01)
*B23Q 1/34* (2006.01)
*B23Q 1/36* (2006.01)
*B81C 1/00* (2006.01)
*H01L 21/67* (2006.01)
(Continued)

(52) U.S. Cl.
CPC .................. *B23Q 1/34* (2013.01); *B23Q 1/36* (2013.01); *B81C 1/00126* (2013.01); *H01L 21/67126* (2013.01); *H02K 41/02* (2013.01); *B23Q 1/58* (2013.01); *B23Q 5/28* (2013.01); *B23Q 2210/002* (2013.01)

(58) Field of Classification Search
CPC ...... B23Q 1/34; B23Q 1/36; B23Q 2210/002; B23Q 1/58; B23Q 5/28; H02K 41/02; B81C 1/00126; B81C 1/00; H01L 21/67126
USPC .................................. 310/12.19, 15, 17, 36
See application file for complete search history.

(56) References Cited

U.S. PATENT DOCUMENTS

3,612,395 A * 10/1971 English .................. B60L 13/03
                                                        238/122
4,733,143 A *  3/1988 Chitayat .............. H02K 41/035
                                                        310/12.05
(Continued)

*Primary Examiner* — John K Kim
(74) *Attorney, Agent, or Firm* — Erson IP (Nelson IP)

(57) ABSTRACT

The present invention discloses a single-drive rigid-flexible coupling precision motion platform, including a machine base, a linear guide rail, a rigid-flexible coupling motion platform, a linear driver and a displacement sensor, wherein the rigid-flexible coupling motion platform includes a rigid frame, flexible hinges and a core motion platform; and the core motion platform of the rigid-flexible coupling motion platform is connected with the rigid frame through the flexible hinges. In this arrangement, the single-drive rigid-flexible coupling precision motion platform disclosed by the present invention can realize high-accuracy continuous change displacements of the platform, thereby avoiding displacement "jitter" caused by sudden change of acceleration. The present invention further discloses a realization method and an application including the above platform.

4 Claims, 13 Drawing Sheets

(51) Int. Cl.
 B23Q 1/58 (2006.01)
 B23Q 5/28 (2006.01)

(56) References Cited

U.S. PATENT DOCUMENTS

| | | | | |
|---|---|---|---|---|
| 7,504,751 | B2* | 3/2009 | Kraus | B26B 19/282 |
| | | | | 310/12.04 |
| 2004/0227412 | A1* | 11/2004 | Tamai | H02K 41/03 |
| | | | | 310/12.19 |
| 2010/0001616 | A1* | 1/2010 | Ferreira | H02N 1/008 |
| | | | | 310/300 |
| 2015/0059473 | A1* | 3/2015 | Jia | G01O 19/5747 |
| | | | | 73/504.12 |
| 2015/0101479 | A1* | 4/2015 | Essbaum | F41F 7/00 |
| | | | | 89/1.819 |
| 2018/0104779 | A1* | 4/2018 | Yang | B81C 1/00126 |

* cited by examiner

SINGLE-DRIVE RIGID-FLEXIBLE COUPLING PRECISION MOTION PLATFORM AND REALIZATION METHOD AND APPLICATION THEREOF

CROSS-REFERENCE TO RELATED APPLICATIONS

This application is a continuation of International Patent Application No. PCT/CN2016/093259 with a filing date of Aug. 4, 2016, designating the United States, now pending, and further claims priority to Chinese Patent Application No. CN201610508540.X with a filing date of Jun. 29, 2016. The content of the aforementioned applications, including any intervening amendments thereto, are incorporated herein by reference.

TECHNICAL FIELD

The present invention relates to motor driving technologies, and particularly relates to a single-drive rigid-flexible coupling precision motion platform and a realization method and an application thereof.

BACKGROUND OF THE PRESENT INVENTION

A high-speed precision motion platform is widely used in the fields of semiconductor encapsulation and the like. Uncertain change of surface roughness between motion pairs in the high-speed precision motion platform causes uncertain change of amplitude of frictional resistance. However, in processes of starting, stop and micro feeding of the motion platform, the speed of the motion platform is relatively low and fluctuation of the amplitude of the above frictional resistance is easy to cause a "crawl" phenomenon of the motion platform. Under the action of a closed-loop control system, a driver overcomes the frictional resistance by increasing the driving force to compensate for a positioning error of the motion platform. In the above compensation process, the motion platform will experience frequent "static-moving" state switching. In the "static-moving" process, the frictional resistance between the motion pairs experiences "static frictional force-moving frictional force" state switching. However, sudden change of the acceleration at a moment of the state switching is caused by a difference between a static friction coefficient and a moving friction coefficient, thereby causing "jitter" of the motion platform near a final position location and influencing positioning accuracy.

How to reduce a positioning error influence caused by switching of frictional states in the processes of starting, stop and micro feeding is an important problem that affects execution accuracy of the high-speed precision motion platform. In view of the above problem, the following solutions exist at present:

1. An accurate frictional force model is established, and a manner of controlling driving force compensation by motion is adopted:

2. The design of frictionless or low-friction motion pairs is adopted. For example, structural designs of an air floatation bearing, a magnetic levitation bearing or flexible hinges of a micro feeding platform are adopted.

Because of such factors as microscopic property difference of contact surfaces, manufacturing errors and the like between the motion pairs, it is difficult to establish a highly accurate frictional force model, so that a complex compensation control method needs to be adopted in a motion control system.

Implementation cost of low-friction motion pairs of the air floatation bearing or the magnetic levitation bearing and the like is high, thereby limiting use ranges.

The flexible hinges as external frictionless motion pairs realize continuous high-accuracy motion by means of elastic deformation. Due to the limit of an operation principle, flexible hinge motion pairs are mainly applicable to micro-stroke motion. In occasions of large-stroke motion, the flexible hinges are often used together with friction motion pairs to form a macro-micro composite motion platform to realize large-stroke high-accuracy motion, so as to compensate for large-range motion.

Patent application CN1201410696217.0 proposes a linear motor co-stator dual-drive macro-micro integrated high-speed precision motion one-dimensional platform. A macro-moving outer frame and a micro-moving platform of the proposed macro-micro motion platform are respectively connected with two groups of linear motor movers, wherein the macro-moving outer frame and the micro-moving platform are connected through flexible hinges; the macro-moving outer frame realizes large-stroke macro motion under the drive of a corresponding linear motor mover; and the micro-moving platform dynamically compensates for a motion deviation of the above macro motion under the drive of a corresponding linear motor mover. The large-stroke high-accuracy motion is realized by using the above macro-micro composite motion principle. Because the design of frictionless flexible hinge motion pairs is adopted in the micro-moving platform of the motion platform, continuous displacement change in a positioning process is realized. The motion platform proposed in patent application CN201410696217.0 has the following main disadvantages: (a) because macro-micro composite control is adopted, a macro-moving platform and the micro-moving platform of the motion platform need respective drivers and displacement sensors to form feedback systems, causing high cost; (2) switching control of the macro motion and the micro motion needs to be considered in the control system, causing that the control system is complex; (3) the mass of a motion part in the platform is large, which is not beneficial for use in occasions under a large-inertia influence such as high acceleration and the like; and (4) the feedback control system of the macro-moving platform still needs to consider the influence of the frictional state in a positioning phase to ensure that a displacement deviation of the macro-moving platform is less than an ultimate deformation range of the flexible hinge motion pairs in the positioning process.

SUMMARY OF PRESENT INVENTION

To solve the above technical problems, the purpose of the present invention is to realize simplified control and structural optimization of a motor driving platform. Specifically, the present invention provides a single-drive rigid-flexible coupling precision motion platform and a realization method and an application thereof.

The single-drive rigid-flexible coupling precision motion platform provided in the present invention comprises a machine base, a linear guide rail, a rigid-flexible coupling motion platform, a linear driver and a displacement sensor, wherein the rigid-flexible coupling motion platform comprises a rigid frame, flexible hinges and a core motion platform.

The core motion platform of the rigid-flexible coupling motion platform is connected with the rigid frame through the flexible hinges.

The core motion platform of the rigid-flexible coupling motion platform is connected with the linear driver; the rigid frame is connected with the linear guide rail fixed on the machine base through a guide rail sliding block; and the core motion platform drives the flexible hinges to generate elastic deformation under the action of the linear driver, and drives the rigid frame to freely move in a lengthwise direction of the linear guide rail through the flexible hinges.

The displacement sensor is connected with the core motion platform and is used for measuring a displacement of the core motion platform in a motion direction.

Preferably, the linear driver is a voice coil motor or a linear motor.

Preferably, a limiting apparatus and a damper are arranged between the rigid frame of the rigid-flexible coupling motion platform and the core motion platform.

Preferably, the flexible hinges between the core motion platform of the rigid-flexible coupling motion platform and the rigid frame are symmetrically arranged.

Preferably, the rigid-flexible coupling motion platform is formed by integrated processing and manufacturing.

Preferably, the flexible hinges are straight beam type or notch type flexible hinges.

The present invention further provides a realization method for a single-drive rigid-flexible coupling precision motion platform, realized by using the above single-drive rigid-flexible coupling precision motion platform and comprising the following steps:

1) the linear driver directly drives the core motion platform; when driving force does not overcome static friction of the rigid frame, the core motion platform generates a micro displacement through the elastic deformation of the flexible hinges, thereby realizing precision micro feeding;

2) when the driving force of the linear driver is increased, the driving force overcomes the friction to drive the rigid frame to move; at this moment, the elastic deformation is increased; the core motion platform enters a limiting state; all the driving force is transferred to the rigid frame to perform high-speed motion; and 3) when the platform is decelerated, the core motion platform is firstly braked; the rigid frame is driven to be braked through the flexible hinges; and then, switch to another limiting apparatus and damper to attenuate vibration energy.

The present invention further provides an application of a single-drive rigid-flexible coupling precision motion platform. The single-drive rigid-flexible coupling precision motion platform is applied to a large-stroke precision processing device and adopts the above single-drive rigid-flexible coupling precision motion platform as a motor driving platform.

Accordingly, the present invention further provides a realization method for an application of a single-drive rigid-flexible coupling precision motion platform, applied to a large-stroke precision processing device and using the above realization method for the single-drive rigid-flexible coupling precision motion platform to realize motor driving.

The present invention has the following beneficial effects:

1) Frictionless flexible hinge motion pairs are adopted to realize high-accuracy continuous change displacements, thereby avoiding displacement "jitter" caused by sudden change of acceleration due to switching of frictional states of the motion pairs under a low-speed working condition.

2) The design of the rigid-flexible coupling motion platform is adopted; the used flexible hinges can actively adapt to the change of the frictional force of guide rail motion pairs by means of self elastic deformation, thereby avoiding influencing continuous displacement positioning by "crawl" due to switching of the frictional states of the motion pairs and benefiting realization of higher positioning accuracy.

3) The motion platform adopts a single-drive closed-loop control system; the adopted driver and sensor are connected to the core motion platform; the control system is simple in design and high in reliability.

4) The motion platform adopts compact design, can realize smaller motion mass relative to a macro-micro composite motion platform, and is more favorable for application in high acceleration occasions and the like.

DESCRIPTION OF SERIAL NUMBER linear guide rail 1; rigid frame 201; core motion platform 202; flexible hinge 203; damper 3;

linear guide rail A101; linear guide rail sliding block A102; motion platform rigid frame A201; core motion platform A202; flexible hinge A203; damping device A3; machine base A4; linear motor mover A501; linear motor stator A502; grating displacement sensor A6; linear bearing bushing A701; optical axis A702;

linear guide rail B101; linear guide rail sliding block B102; motion platform rigid frame B201; core motion platform B202; flexible hinge B203; damping device B3; machine base B4; linear motor mover B501; linear motor stator B502; grating displacement sensor B6; magnetic block IB701; magnetic block IIB702;

crossed roller linear guide rail C1; motion platform rigid frame C201; core motion platform C202; flexible hinge C203; mover connecting piece C301; machine base C4; anti-collision block C6; voice coil motor mover C501; voice coil motor stator C502; grating displacement sensor C7; and damping device C8.

DETAILED DESCRIPTION OF PREFERRED EMBODIMENTS

Technical solutions in embodiments of the present invention will be clearly and completely described in combination with drawings in embodiments of the present invention. Apparently, described embodiments are only part of embodiments of the present invention, not all of embodiments. All other embodiments obtained by those ordinary skilled in the art based on embodiments in the present invention without contributing creative labor belong to a protection scope of the present invention.

Figure 1:
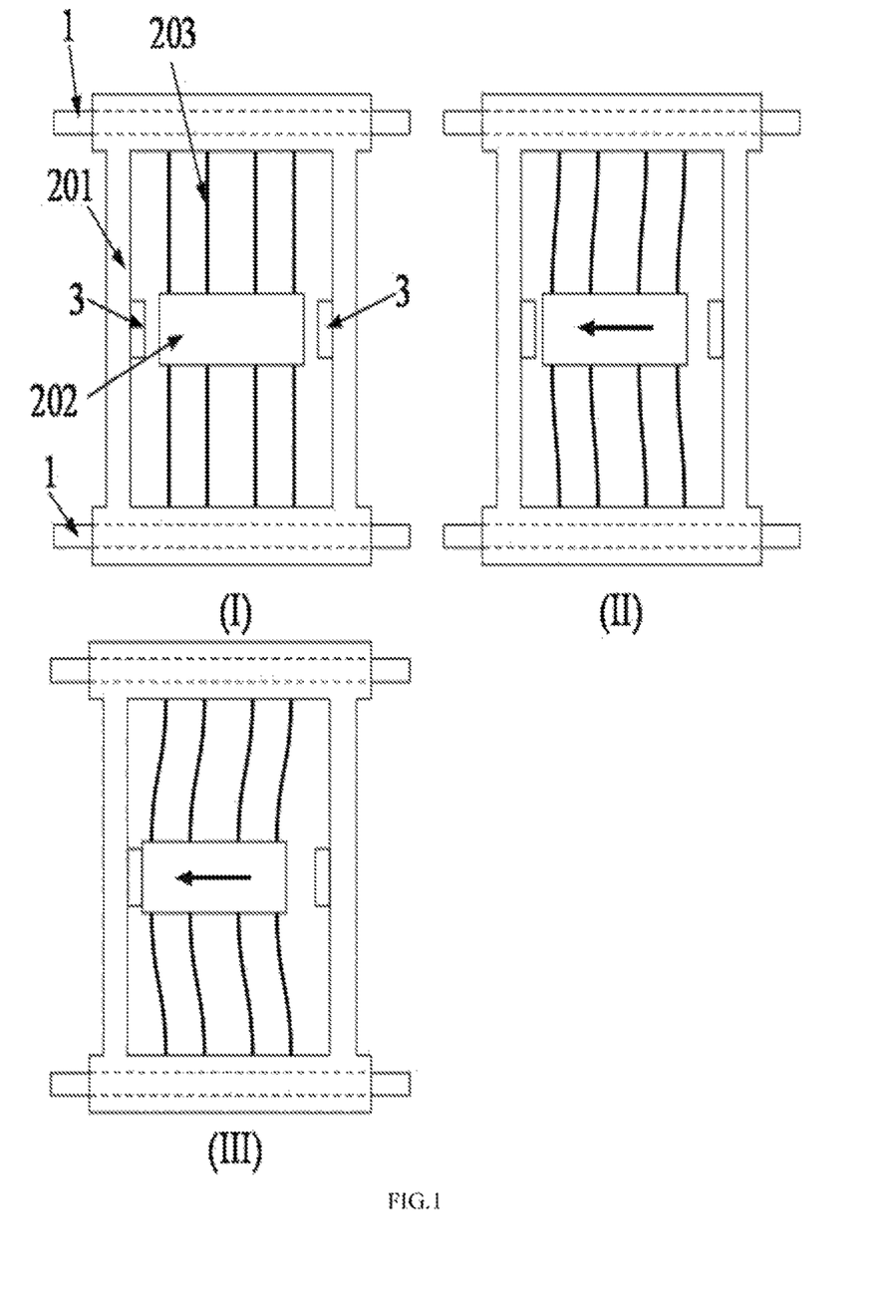
FIG. 1 shows schematic diagrams of a working principle of a rigid-flexible coupling motion platform in the present invention.
Figure 2:
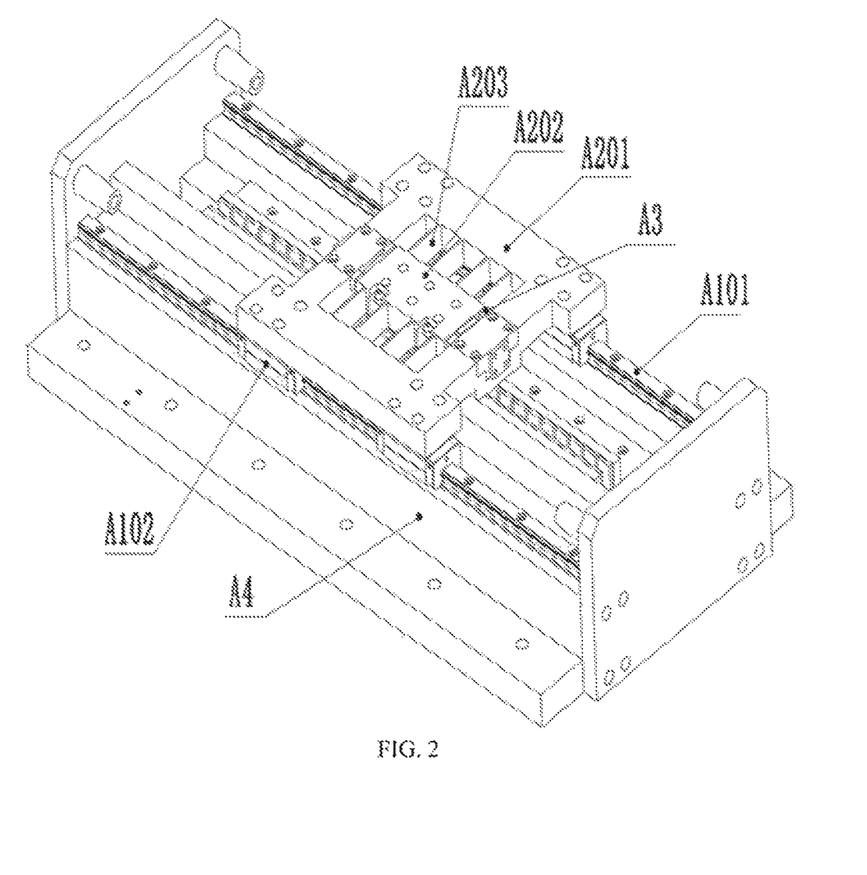
FIG. 2 shows a schematic diagram of embodiment A of the present invention.
Figure 3:
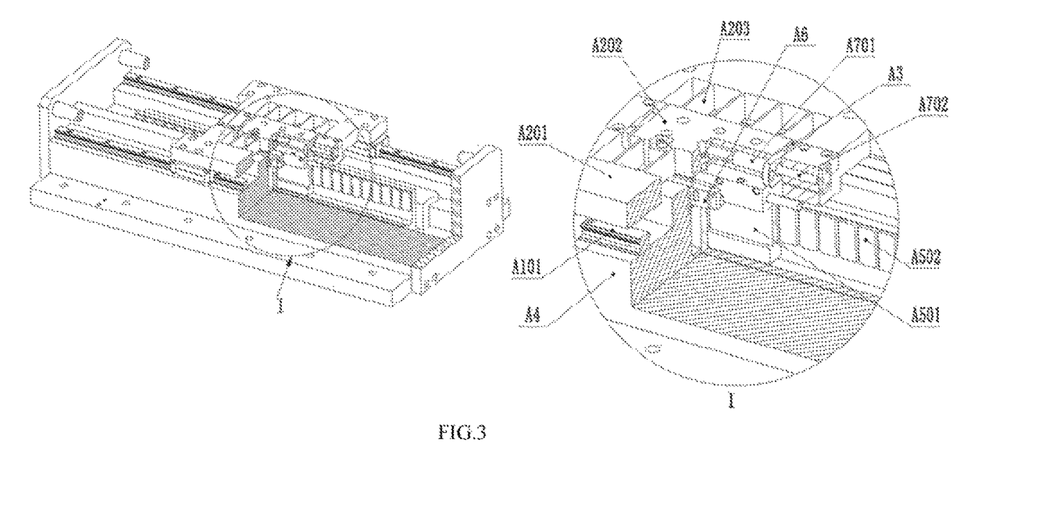
FIG. 3 shows local sectional amplified schematic diagrams of embodiment A of the present invention.

An embodiment A of a motion platform proposed by the present invention is as follows:

As shown in FIG. 1 to FIG. 3, the motion platform mainly consists of a machine base A4, a linear guide rail A101, a guide rail sliding block A102, a rigid frame A201, a core motion platform A202, flexible hinges A203, a grating displacement sensor A6, a linear motor driver and the like, wherein the rigid frame A201 is connected with the core motion platform A202 through flexible hinges A203 motion pairs, and the rigid frame A201 is connected with the machine base A4 through linear guide rail motion pairs.

The linear motor driver is composed of a linear motor mover A501 and a linear motor stator A502, wherein the linear motor mover A501 is connected with the core motion platform A202, and the linear motor mover A501 can exert driving force to the core motion platform A202 under the action of electromagnetic force. The driving force can enable the flexible hinges A203 to generate elastic deformation and then enable the core motion platform A202 to generate a linear displacement along a lengthwise direction of the guide rail. Reaction force of the elastic deformation of the flexible hinges A203 can be used for overcoming frictional force between the linear guide rail motion pairs connected with the rigid frame A201. When the reaction force of the elastic deformation of the flexible hinges A203 is greater than resistance such as static frictional force between the linear guide rail motion pairs, the rigid frame A201 is changed from a static state to a motion state.

The displacement of the core motion platform A202 may have two cases: a. when the elastic deformation force of the flexible hinges A203 is less than resistance such as static frictional force between the motion pairs, the displacement of the core motion platform A202 is the elastic deformation amount of the flexible hinges A203 motion pairs; and b. when the elastic deformation force of the flexible hinges A203 is greater than resistance such as static frictional force between the motion pairs, the displacement of the core motion platform A202 is the superposition of the elastic deformation amount of the flexible hinges A203 motion pairs and the rigid displacement of the rigid frame A201. When the motion state of the linear guide rail motion pairs is switched between case a and case b, sudden change of the resistance is caused by a difference between a static friction coefficient and a moving friction coefficient of the linear guide rail motion pairs, thereby generating rigid impact on the motion platform and causing friction "crawl" of the motion pairs. The flexible hinges A203 can actively adapt to the sudden change of the frictional resistance due to switching of the friction state of the motion pairs by means of self elastic deformation, thereby alleviating rigid impact on the core motion platform A202 due to the sudden change of the frictional resistance. In either case, the core motion platform A202 can realize continuous displacement change by means of the elastic deformation of the flexible hinges A203, thereby avoiding influencing motion positioning accuracy due to the frictional "crawl" condition.

The grating displacement sensor A6 is connected with the core motion platform A202, and can measure the displacement of the core motion platform A202 in any case in real time. The measurement of the displacement of the grating displacement sensor A6 can act as a feedback link to form a closed-loop control system with the linear motor driver and the like, thereby realizing high-accuracy motion positioning of the core motion platform A202.

When the motion platform is under the condition of high acceleration, the linear motor driver easily causes that the deformation amount of the flexible hinges A203 exceeds ultimate elastic deformation amount through the driving force of the core motion platform A202 acting on the flexible hinges A203. When the elastic deformation amount of the flexible hinges A203 exceeds the ultimate elastic deformation amount, the core motion platform A202 comes into contact with the rigid frame A201 and forms an entire rigid motion platform. A damping device A3 is arranged between the core motion platform A202 and the rigid frame A201, and used for alleviating contact impact force between the core motion platform A202 and the rigid frame A201.

Figure 4:
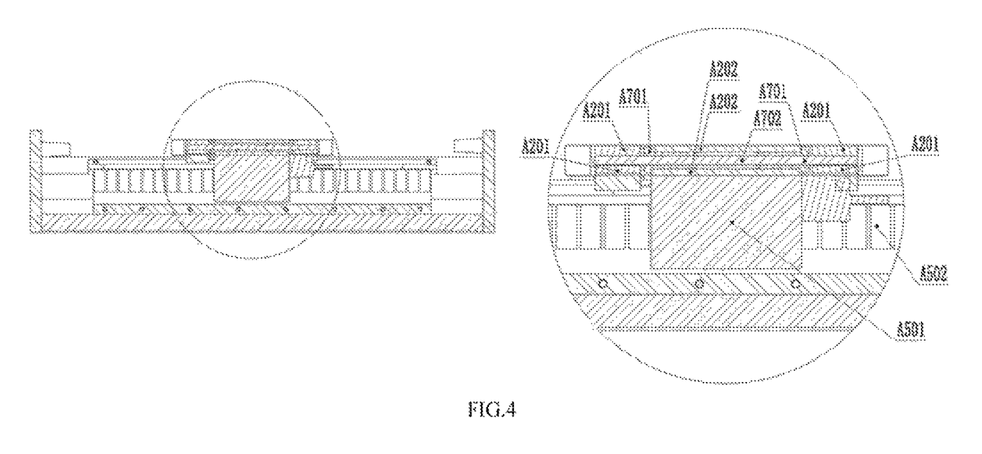
FIG. 4 shows a front sectional view and a local amplified diagram of embodiment A of the present invention.

As shown in FIG. 3 and FIG. 4, to increase bearing capacity of the core motion platform A202, a linear bearing unit is arranged between the rigid frame A201 and the core motion platform A202, wherein an optical axis A702 is arranged between two supporting ends of the rigid frame A201, and a linear bearing bushing A701 is installed on the core motion platform A202. The motion freedom of the linear bearing bushing A701 is limited to a lengthwise direction of the optical axis A702. The optical axis A702 installed on the rigid frame A201 and the linear bearing bushing A701 installed on the core motion platform A202 jointly form a stiffness increasing unit used for enhancing the bearing capacity of the core motion platform A202.

Figure 5:
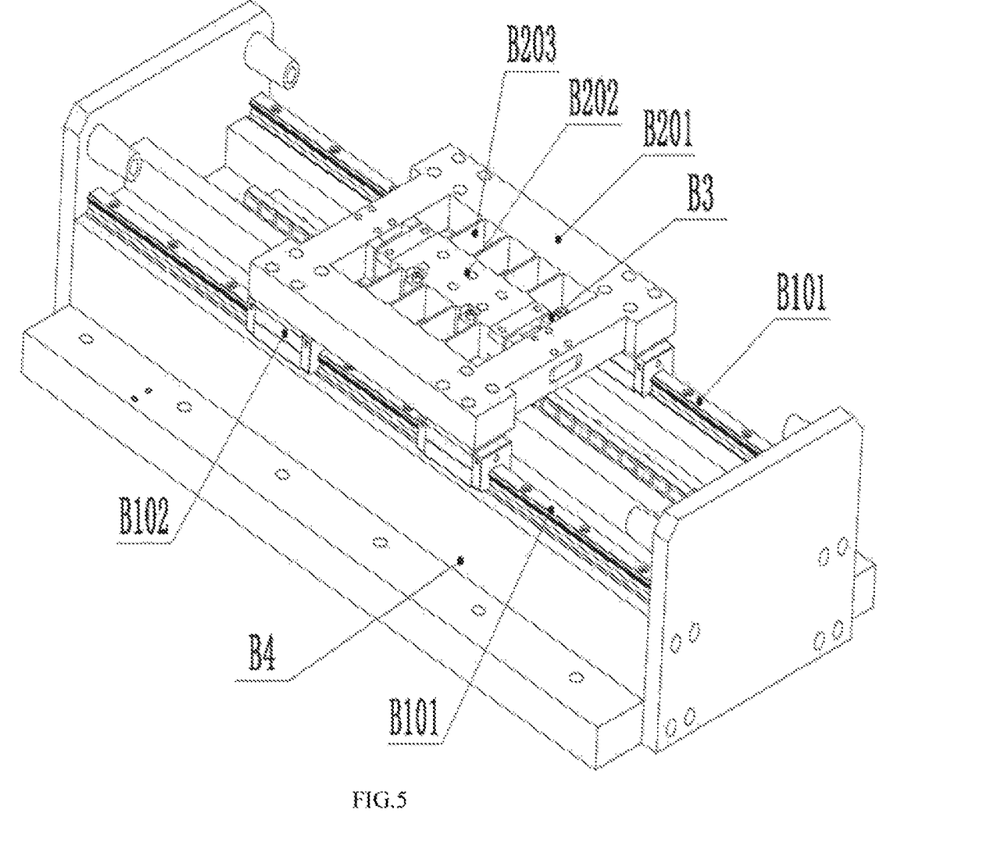
FIG. 5 shows a schematic diagram of embodiment B of the present invention.
Figure 6:
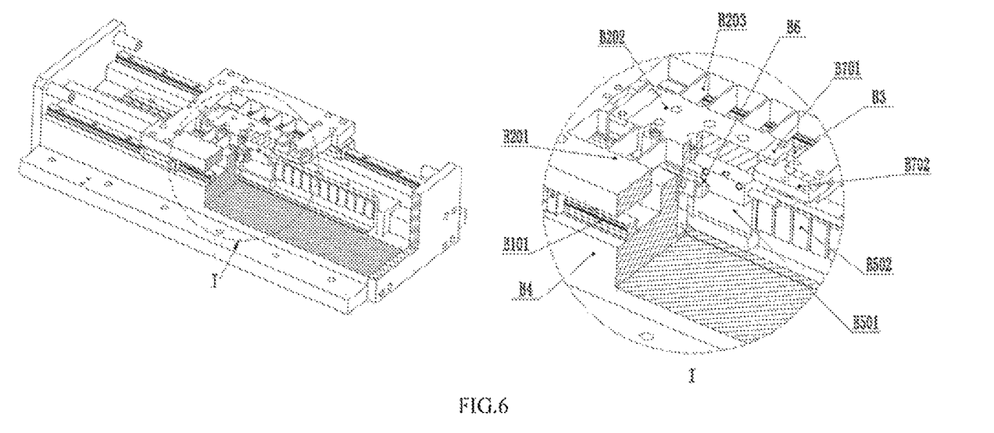
FIG. 6 shows local sectional amplified schematic diagrams of embodiment B of the present invention.

An embodiment B of a motion platform proposed by the present invention is as follows:

As shown in FIG. 5 and FIG. 6, the structural design and the motion principle of the motion platform in the embodiment B are the same as those in the embodiment A. The motion platform mainly consists of a machine base B4, a linear guide rail B101, a guide rail sliding block B102, a rigid frame B201, a core motion platform B202, flexible hinges B203, a grating displacement sensor B6, a linear motor driver and the like, wherein the rigid frame B201 is connected with the core motion platform B202 through flexible hinges B203 motion pairs, and the rigid frame B201 is connected with the machine base B4 through linear guide rail motion pairs. The linear motor driver is composed of a linear motor mover B501 and a linear motor stator B502, wherein the linear motor mover B501 is connected with the core motion platform B202, and the linear motor mover B501 can exert driving force to the core motion platform B202 under the action of electromagnetic force. A damping device B3 is arranged between the core motion platform B202 and the rigid frame B201, and used for alleviating contact impact force between the core motion platform B202 and the rigid frame B201.

Relative to the embodiment A, a main change point of the embodiment B is that the design of the stiffness increasing unit adopted for enhancing the bearing capacity of the core motion platform in the embodiment A is further improved.

Figure 7:
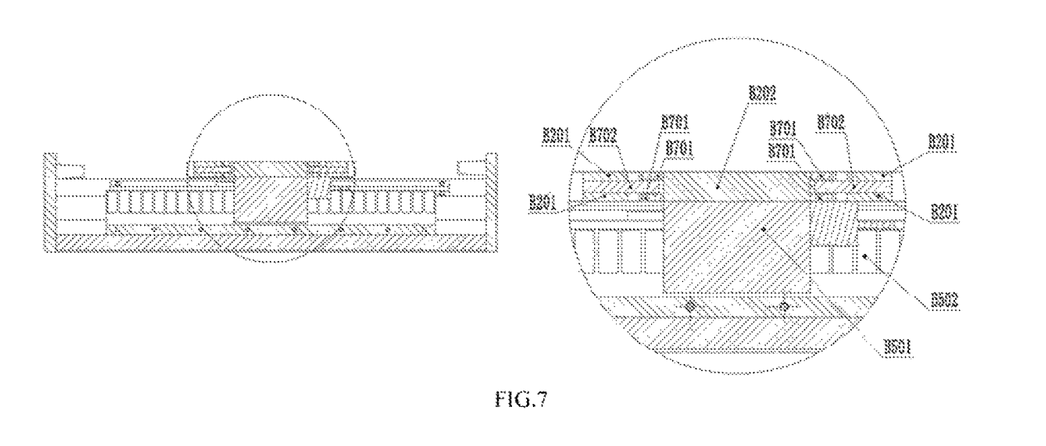
FIG. 7 shows a front sectional view and a local amplified diagram of embodiment B of the present invention.

As shown in FIG. 6 and FIG. 7, magnetic blocks IIB702 are arranged on the rigid frame B201, and magnetic blocks IB701 are arranged on the core motion platform B202. The magnetic blocks IIB702 are always in the middle of the magnetic blocks IB701 in a motion process of the platform. Identical magnetic polarity is adopted on upper opposite surfaces of the magnetic blocks IIB702 and the magnetic blocks IB701, and identical magnetic polarity is also adopted on lower opposite surfaces of the magnetic blocks IIB702 and the magnetic blocks IB701. Through the above magnetic polarity arrangement mode, the magnetic blocks IIB702 are constrained between the magnetic blocks IIB702 by magnetic repulsion force caused by the magnetic blocks IB701, so as to enhance the bearing capacity of the core motion platform B202. The magnetic blocks IIB702 and the magnetic blocks IB701 jointly form a non-contact type rigid increasing unit.

Figure 8:
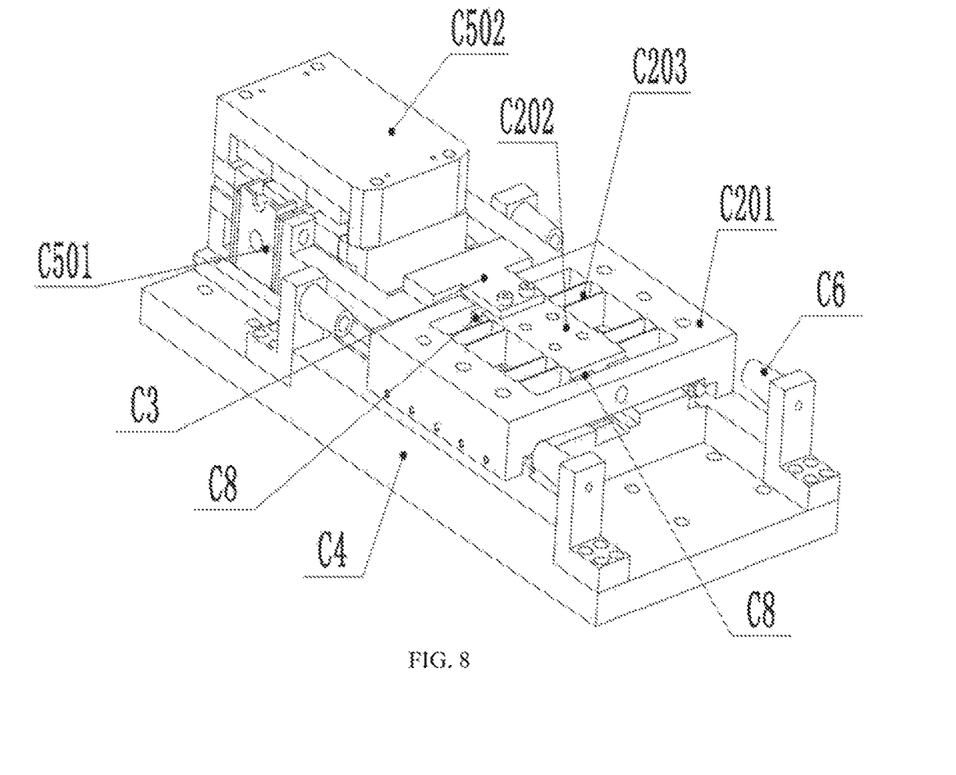
FIG. 8 shows a schematic diagram of embodiment C of the present invention.
Figure 9:
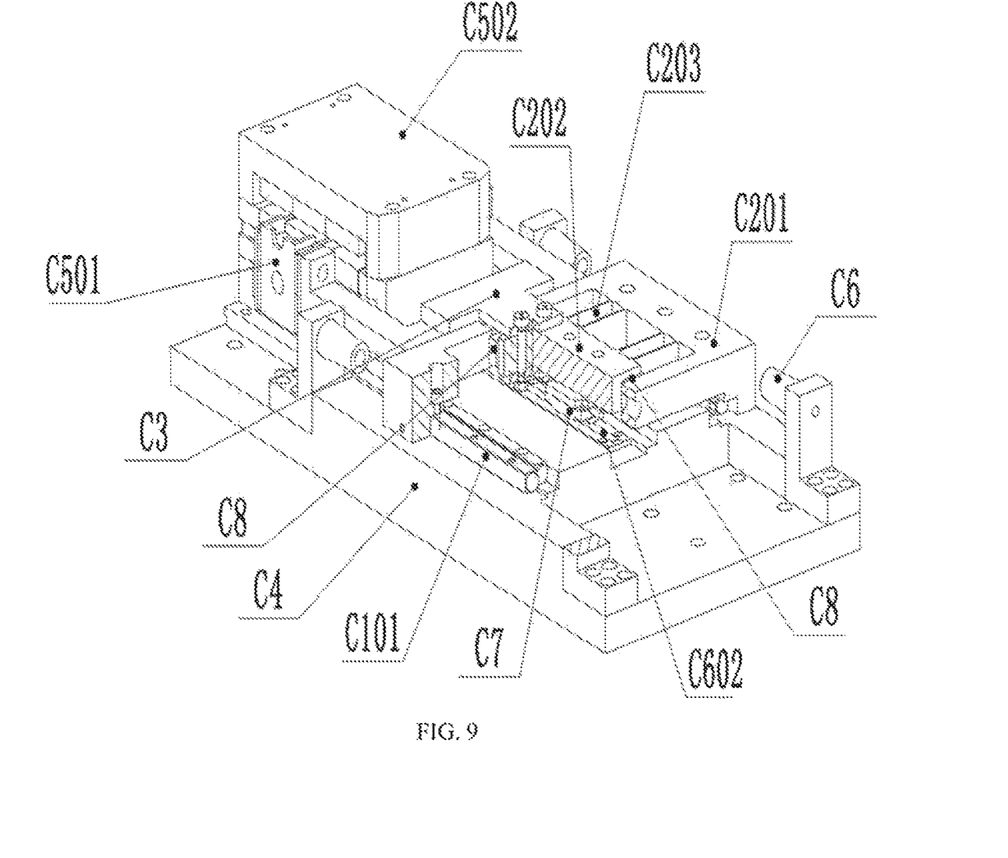
FIG. 9 shows a local sectional amplified schematic diagram of embodiment C of the present invention.
Figure 10:
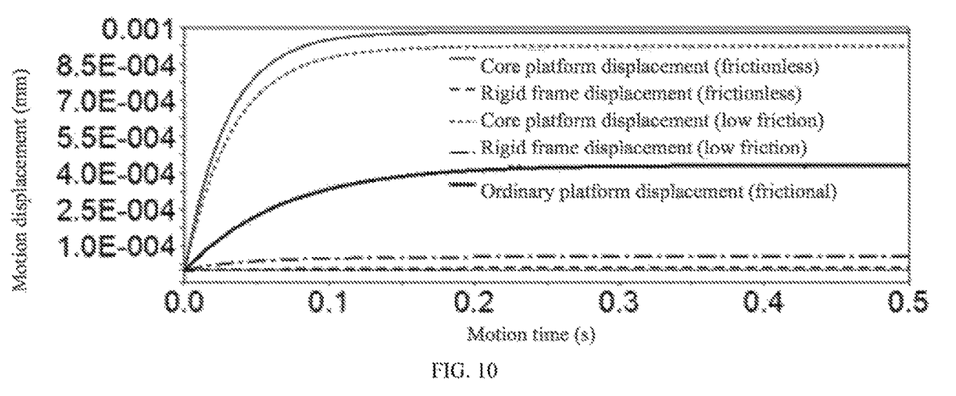
FIG. 10 shows a curve chart of 1 μm precision micro feeding experimental data of the present invention.

An embodiment C of a motion platform proposed by the present invention is as follows:

As shown in FIG. 8 and FIG. 9, the motion platform mainly consists of a machine base C401, a crossed roller linear guide rail C1, a rigid frame C201, a core motion platform C202, flexible hinges C203, a grating displacement sensor C7, a voice coil motor and the like, wherein the rigid frame C201 is connected with the core motion platform C202 through the flexible hinges C203 motion pairs, and the rigid frame C201 is connected with the machine base C401 through linear guide rail motion pairs.

The voice coil motor driver is composed of a voice coil motor mover C501 and a voice coil motor stator C502, wherein the voice coil motor mover C501 is connected with the core motion platform C202 through a mover connecting piece C3. The voice coil motor mover C501 can exert driving force to the core motion platform C202 under the action of electromagnetic force. The driving force can enable the flexible hinges C203 to generate elastic deformation, and then enable the core motion platform C202 to generate linear displacement along the lengthwise direction of the guide rail. Reaction force of the elastic deformation of the flexible hinges C203 can be used for overcoming frictional force between the linear guide rail motion pairs connected with the rigid frame C201. When the reaction force of the elastic deformation of the flexible hinges C203 is greater than resistance such as static frictional force between the linear guide rail motion pairs, the rigid frame C201 is changed from a static state to a motion state.

The displacement case of the core motion platform C202 can be divided into two cases identical with the cases in the embodiment A. The adopted method for avoiding the influence of the frictional "crawl" is also identical with the method in the embodiment A.

The grating displacement sensor C7 is connected with the core motion platform C202, and can measure the displacement of the core motion platform C202 in any case in real time. The measurement of the displacement of the grating displacement sensor C7 can act as a feedback link to form a closed-loop control system with the voice coil motor driver and the like, thereby realizing high-accuracy motion positioning of the core motion platform C202.

When the motion platform is under the condition of high acceleration, the voice coil motor driver easily causes that the deformation amount of the flexible hinges C203 exceeds ultimate elastic deformation amount through the driving force of the core motion platform C202 acting on the flexible hinges C203. When the elastic deformation amount of the flexible hinges C203 exceeds the ultimate elastic deformation amount, the core motion platform C202 comes into contact with the rigid frame C201 and forms an entire rigid motion platform. A damping device C8 is arranged between the core motion platform C202 and the rigid frame C201, and used for alleviating contact impact force between the core motion platform C202 and the rigid frame C201.

In order to describe implementation effects of the present invention, two cases of 1 μm micro displacement feeding and 100 mm rapid positioning are given. An ordinary platform (with a static friction coefficient of 0.2 and a moving friction coefficient of 0.15), and a low friction (with a friction coefficient which is 1/10 of that of the ordinary platform) and frictionless solution in the present embodiment are compared.

Table 1 Comparison of Motion Accuracy of Precision Micro Feeding (1 μm)

It can be seen from Table 1 that during precision micro feeding, due to the action of friction, the actual displacement of the ordinary platform is only 0.44484 μm, deviating from a target by −56.616%. Through adoption of a low-friction rigid-flexible coupling macro-micro composite platform in the present invention, the elastic deformation displacement of the core platform is 0.92547 μm, deviating from a target by −7.453%, and the displacement of the rigid frame is only 0.05071 μm. Through adoption of a frictionless rigid-flexible coupling macro-micro composite platform in the present invention, the elastic deformation displacement of the core platform is 0.98611 μm, deviating from a target by −1.389%, and the displacement of the rigid frame is only 0.010593 μm.

It can be seen that during precision micro feeding, due to the action of friction, a large positioning error is generated. Through rigid-flexible motion coupling in the solution, low-friction or frictionless elastic deformation generates a micro displacement, thereby realizing precision micro feeding.

Figure 11A:
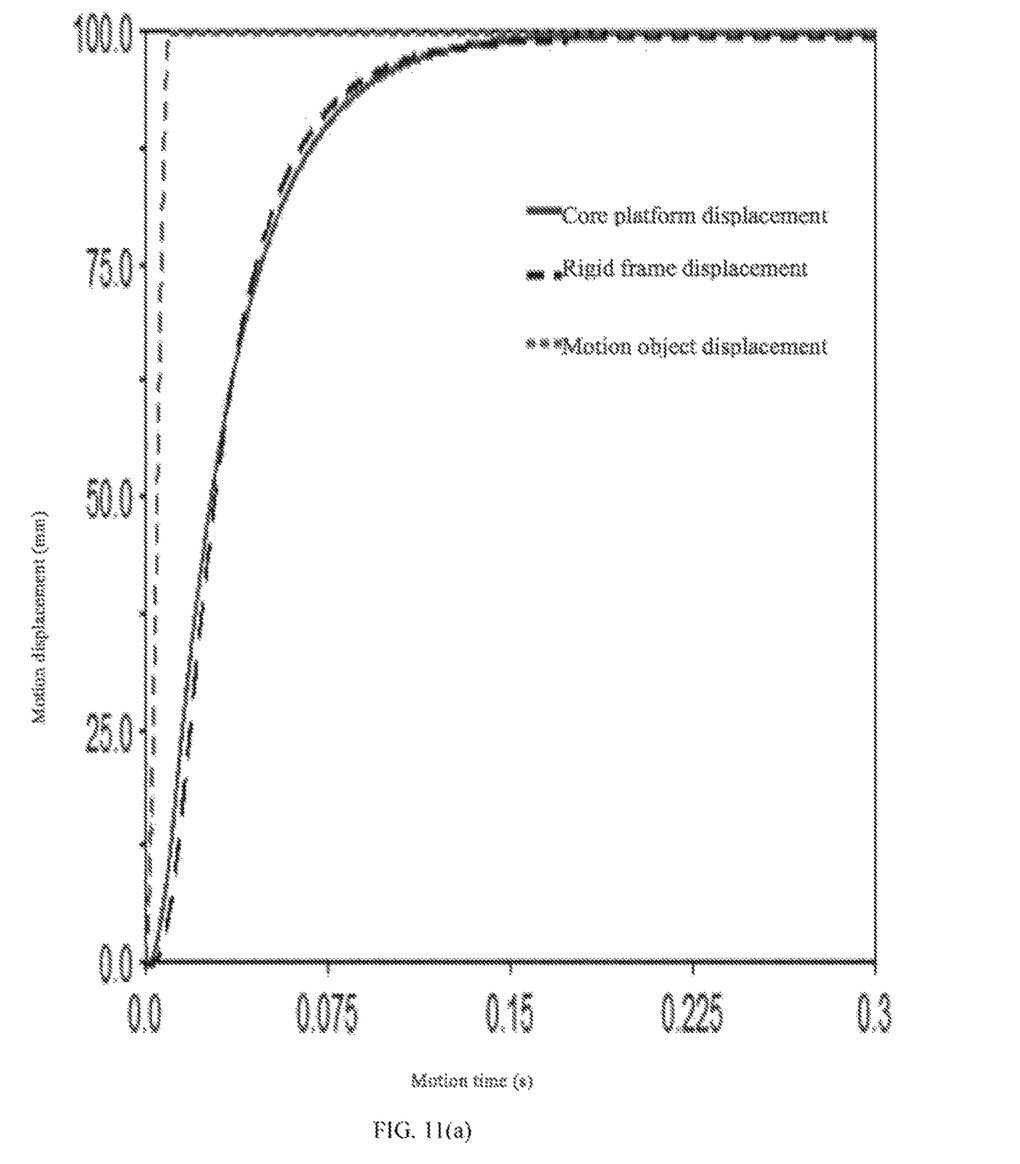
FIGS. 11(a), (b) and (c) shows a curve chart of 100 mm rapid positioning experimental data of the present invention.
Figure 11B:
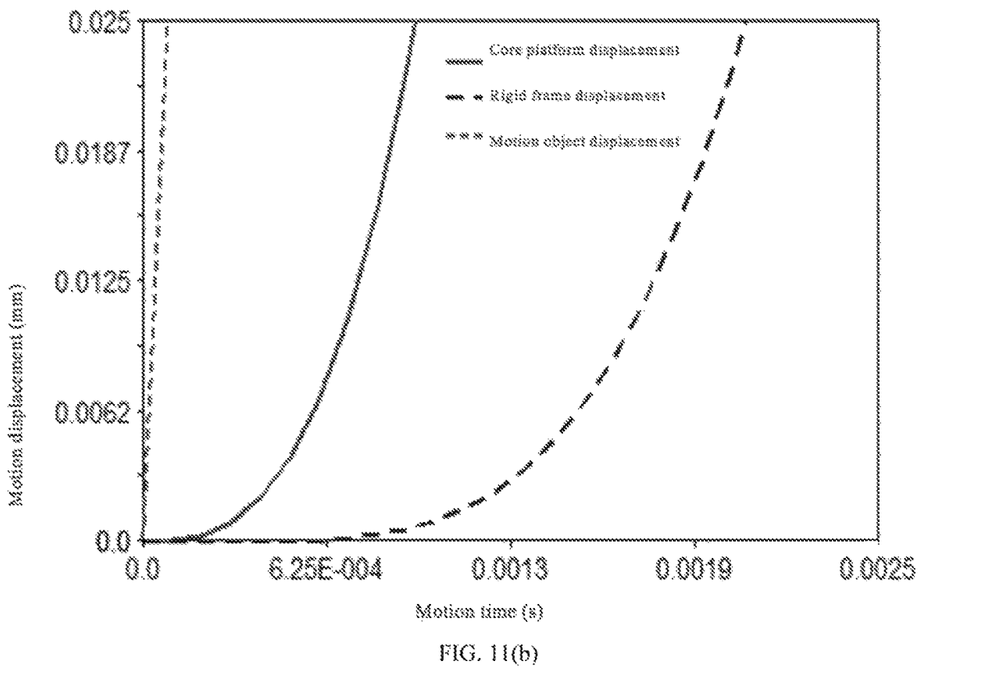
Figure 11C:
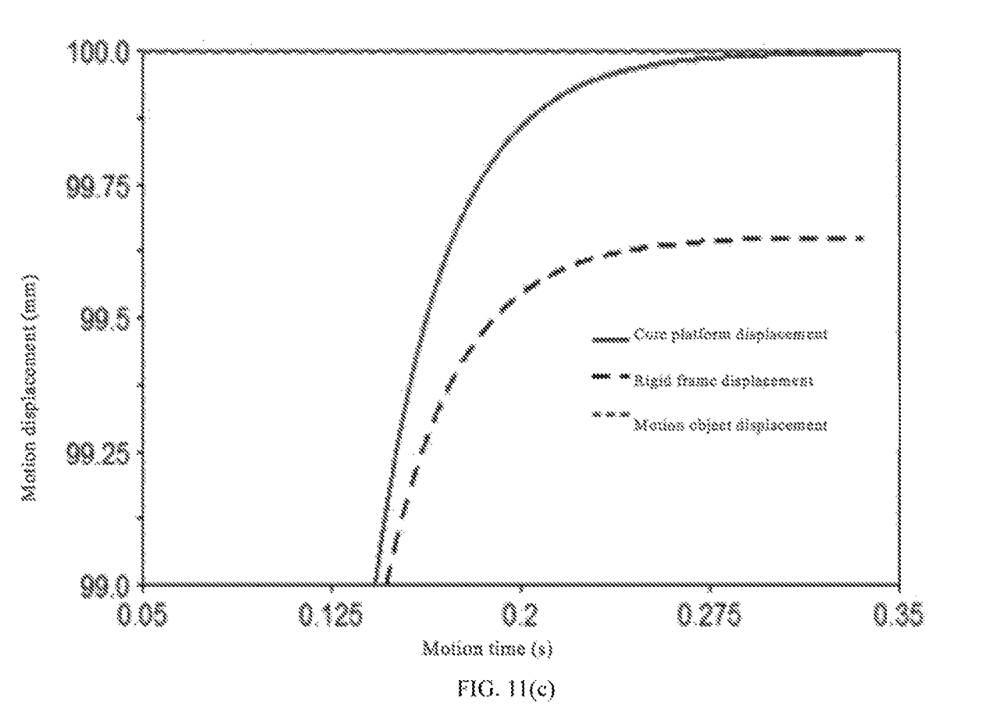

FIG. 11.a shows a rapid positioning case with a stroke of 100 mm. Due to friction, when the driving force is very small, the sliding block is in a static state, and starts to move until the driving force is greater than static friction (FIG. 11.b). During braking, the driving force firstly acts on the core platform to reduce the motion speed of the platform, and then acts on the rigid frame through the flexible hinges. Therefore, the core platform is braked before the rigid frame. When the speed of the rigid frame approaches 0, the rigid frame enters four-wheel drive. At this moment, the core platform completes error compensation through micro feeding of deformation of the flexible hinges (FIG. 11.c).

Table 2 Comparison of Positioning Accuracy with Stroke of 100 mm

It can be seen from Table 2 that, for a frictional ordinary platform, a static position is 99.9968 mm and an error is −0.0032%. After low-friction elastic deformation compounding, positioning accuracy reaches 99.9992 mm and the error reaches −0.0008%. In case of frictionless elastic compensation, the actual displacement is 99.9996, a relative error is −0.0004% and positioning accuracy reaches a sub-micron grade.

In conclusion, because the core platform is connected with the rigid frame through the flexible hinges, when the driving force is not enough to overcome the friction, the core platform generates deformation through the flexible hinges to generate displacement, thereby realizing rapid starting. In a process from high-speed operation to stop, the speed is reduced and the driving force is also reduced, so that a condition that the driving force is less than the static friction also occurs. At this moment, the core platform continues to realize displacement through the deformation of the flexible hinges. The entire process does not need algorithm switching, and the control is simple.

The above describes a single-drive rigid-flexible coupling precision motion platform, a realization method and an application thereof provided by the present invention in detail. Principles and embodiments of the present invention are illustrated by using specific cases in the present invention. Description of above embodiments is only used to help to understand methods and core ideas of the present invention. It should be noted that for those ordinary skilled in the art, several improvements and modifications can also be made to the present invention without departing from the principles of the present invention. These improvements and modifications also fall into a protection scope of claims of the present invention.

We claim:

1. A single-drive precision motion platform, comprising
a machine base,
a linear guide rail located on and connected to the machine base,
a linear driver,
a displacement sensor,
a rigid frame located on the machine base and connected to the machine base through the linear guide rail so that the rigid frame is movable on the machine base,
a plurality of flexible hinges, and
a core motion platform attached to the linear driver;
wherein the core motion platform is movable in a first direction of the linear guide rail under the action of the linear driver; wherein the first direction is the length direction of the linear guide rail;
the plurality of flexible hinges are spaced parallelly in a second direction within the rigid frame, with the core motion platform being located at a center of the rigid frame; wherein the second direction is a width direction of the linear guide rail;
a first end of each of the flexible hinges is secured to the rigid frame and a second end of each of the flexible hinges is secured to the core motion platform, so that a movement of the core motion platform makes the flexible hinges to generate elastic deformation;
the displacement sensor is connected with the core motion platform and is used for measuring a displacement of the core motion platform in a motion direction; and
the flexible hinges are straight beam type or notch type flexible hinges.

2. The single-drive precision motion platform of claim 1, wherein the linear driver is a voice coil motor or a linear motor.

3. The single-drive precision motion platform of claim 1, wherein a damper is arranged on the rigid frame facing the core motion platform, so as to avoid the core motion platform contacting the rigid frame directly.

4. The single-drive precision motion platform of claim 1, wherein the flexible hinges between the core motion platform and the rigid frame are symmetrically arranged with respect to an central axis of the rigid frame in the first direction.

* * * * *